United States Patent
Zhou et al.

(10) Patent No.: US 12,165,954 B2
(45) Date of Patent: *Dec. 10, 2024

(54) COLD PLATES INCORPORATING S-CELLS

(71) Applicant: Toyota Motor Engineering & Manufacturing North America Inc., Plano, TX (US)

(72) Inventors: Feng Zhou, Ann Arbor, MI (US); Hiroshi Ukegawa, South Lyon, MI (US)

(73) Assignee: Toyota Motor Engineering & Manufacturing North America Inc., Plano, TX (US)

( * ) Notice: Subject to any disclaimer, the term of this patent is extended or adjusted under 35 U.S.C. 154(b) by 195 days.

This patent is subject to a terminal disclaimer.

(21) Appl. No.: 17/820,956

(22) Filed: Aug. 19, 2022

(65) Prior Publication Data

US 2024/0063090 A1 Feb. 22, 2024

(51) Int. Cl.
*H05K 7/20* (2006.01)
*H01L 23/473* (2006.01)
*H01L 23/40* (2006.01)
*H01L 23/538* (2006.01)

(52) U.S. Cl.
CPC ....... *H01L 23/473* (2013.01); *H05K 7/20254* (2013.01); *H05K 7/20927* (2013.01); *H01L 23/4006* (2013.01); *H01L 23/5384* (2013.01); *H05K 7/2039* (2013.01)

(58) Field of Classification Search
CPC .......... H05K 7/20254; H05K 7/20927; H05K 7/2039; H01L 23/473; H01L 23/4006; H01L 23/5384

See application file for complete search history.

(56) References Cited

U.S. PATENT DOCUMENTS

| | | | |
|---|---|---|---|
| 6,903,931 B2 | 6/2005 | McCordic et al. | |
| 10,236,791 B1* | 3/2019 | Chung | H02M 7/53875 |
| 10,736,236 B2 | 8/2020 | Engelhardt et al. | |
| 11,183,439 B2 | 11/2021 | Tsai et al. | |
| 2012/0218714 A1* | 8/2012 | Robert | H05K 1/0203 |
| | | | 361/713 |
| 2016/0209133 A1* | 7/2016 | Hu | H01L 21/4882 |
| 2021/0105911 A1 | 4/2021 | Yang et al. | |
| 2023/0139202 A1* | 5/2023 | Zhou | H05K 7/20254 |
| | | | 361/699 |
| 2023/0247807 A1* | 8/2023 | Zhou | H05K 7/20509 |
| | | | 361/711 |
| 2023/0307406 A1* | 9/2023 | Zhou | H05K 7/20927 |

* cited by examiner

*Primary Examiner* — Zachary Pape
(74) *Attorney, Agent, or Firm* — Dinsmore & Shohl LLP (57) ABSTRACT

Power electronics systems including power electronics device assemblies having cold plates are described. A cold plate includes an S-cell having a body with a graphite or graphite-composite material. The body defines a power device recess. The S-cell is disposed within a cavity of the cold plate. The cold plate further includes a bond material bonding the S-cell to a base wall of the cavity.

20 Claims, 5 Drawing Sheets

COLD PLATES INCORPORATING S-CELLS

TECHNICAL FIELD

The present specification generally relates to power electronic assemblies and, more specifically, to cooling devices for power electronic assemblies.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one aspect, a cold plate includes an S-cell having a body with a graphite or graphite-composite material. The body defines a power device recess. The S-cell is disposed within a cavity of the cold plate. The cold plate further includes a bond material bonding the S-cell to a base wall of the cavity.

In another aspect, a power electronics device assembly includes a cold plate defining a cavity and a power electronics device. The cold plate includes an S-cell disposed within the cavity of the cold plate. The S-cell has a body that includes a graphite or graphite-composite material. The body defines a power device recess. The cold plate further includes a bond material bonding the S-cell to a base wall of the cavity. The power electronics device is embedded within the power device recess of the S-cell.

In yet another aspect, a power electronics system includes a circuit board assembly and a power electronics device assembly coupled to the circuit board assembly. The power electronics device assembly includes a cold plate defining a cavity and a power electronics device. The cold plate includes an S-cell disposed within the cavity of the cold plate. The S-cell has a body including a graphite or graphite-composite material. The body defines a power device recess. The cold plate also includes a bond material bonding the S-cell to a base wall of the cavity. The power electronics device is embedded within the power device recess of the S-cell.

These and additional features provided by the aspects and embodiments described herein will be more fully understood in view of the following detailed description, in conjunction with the drawings.

BRIEF DESCRIPTION OF THE DRAWINGS

The aspects and embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are generally directed to power electronics systems having a circuit board assembly coupled to a power electronics device assembly that includes a cold plate containing an S-cell. A power electronics device may be embedded within the S-cell and/or within the circuit board assembly. The S-cell is particularly sized and shaped to ensure a particular thermal conductivity for migrating heat generated by the power electronics device.

The power electronics devices assemblies of the present disclosure include a power electronics device affixed to a mounting substrate referred to herein as an S-cell. As described in more detail below, the S-cell includes an electrically insulating layer that electrically insulates the bottom electrodes of the power electronics device from other components of the power electronics device assembly. For example, the integral electrically insulating layer of the S-cell enables the removal of an electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein include stacked metal, graphite, and one or more electrically insulating layers in a compact package. Since the graphite in the S-cells described herein does not have an isothermal profile, the S-cells described herein are particularly shaped and sized for the purposes of ensuring adequate heat spreading. More specifically, a portion of the S-cell extending along two axes may define an area of high thermal conductivity relative to a portion of the S-cell extending along a third axis, which has a relatively low thermal conductivity. The resulting shape of the S-cell (e.g., a rectangular shape, for example) may allow for heat spreading along the high thermal conductivity axes rather than the low conductivity axis, thereby improving overall heat spreading within the S-cell and/or decreased heat spreading to adjacent S-cells, thereby avoiding an issue where centralized S-cells in a power electronics system overheat.

The cold plates, power electronics device assemblies, circuit board assemblies, power electronics systems, and the like described herein may be used in electrified vehicles, such as and without being limited to, an electric vehicle, a hybrid electric vehicle, any electric motor, generators, industrial tools, household appliances, and the like. The various assemblies described herein may be electrically coupled to an electric motor and/or a battery, and may be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device, inserted within a cavity of a cold plate, and includes one or more of a metal layer, a graphite layer and an electrically insulating layer.

Various embodiments of power electronics device assemblies, power electronics systems, and cold plates are described in detail below. Whenever possible, the same reference numerals will be used throughout the drawings to refer to the same or like parts.

Figure 1:
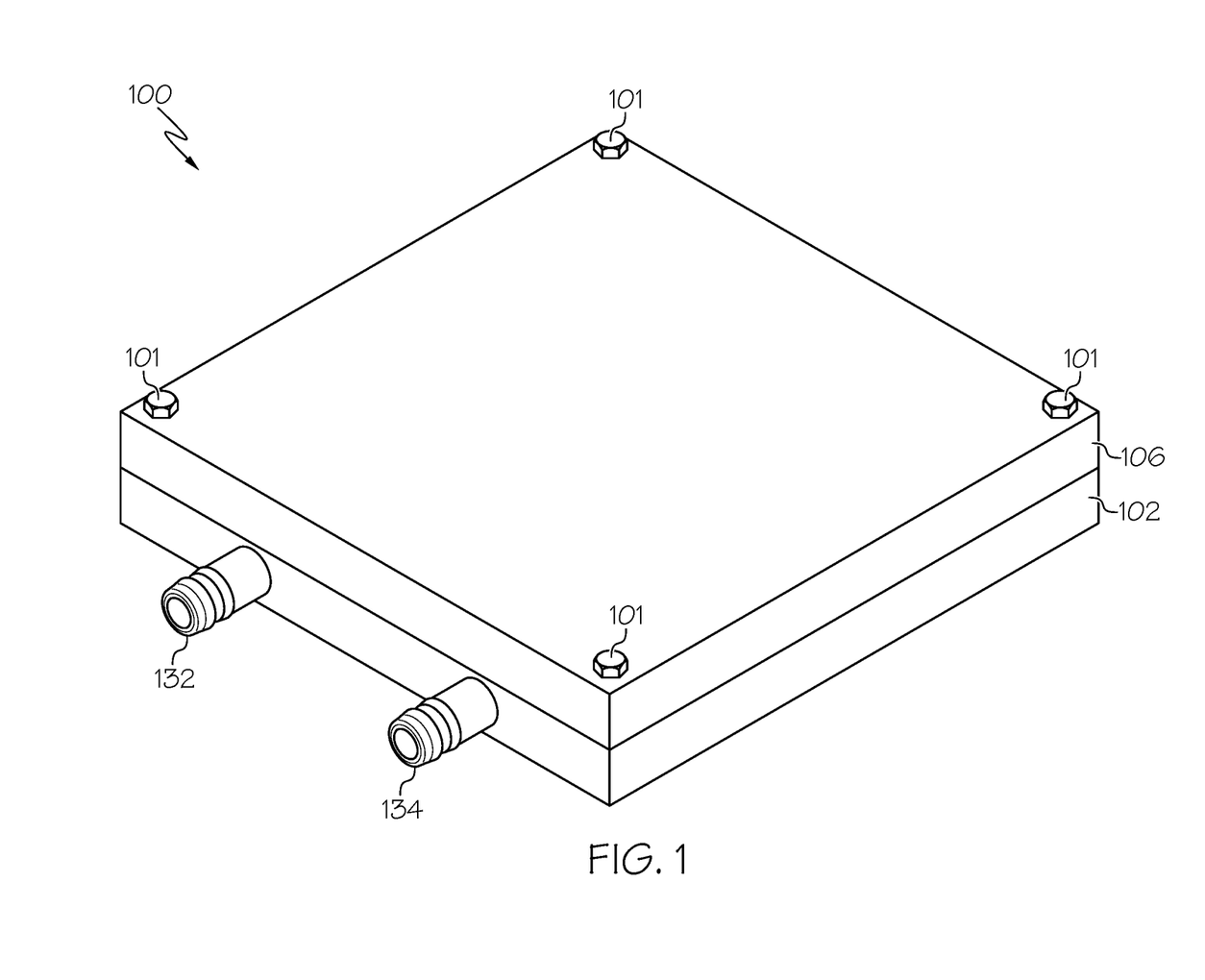
FIG. 1 schematically depicts a perspective view of an illustrative power electronics system according to one or more embodiments described and illustrated herein.
Figure 2:
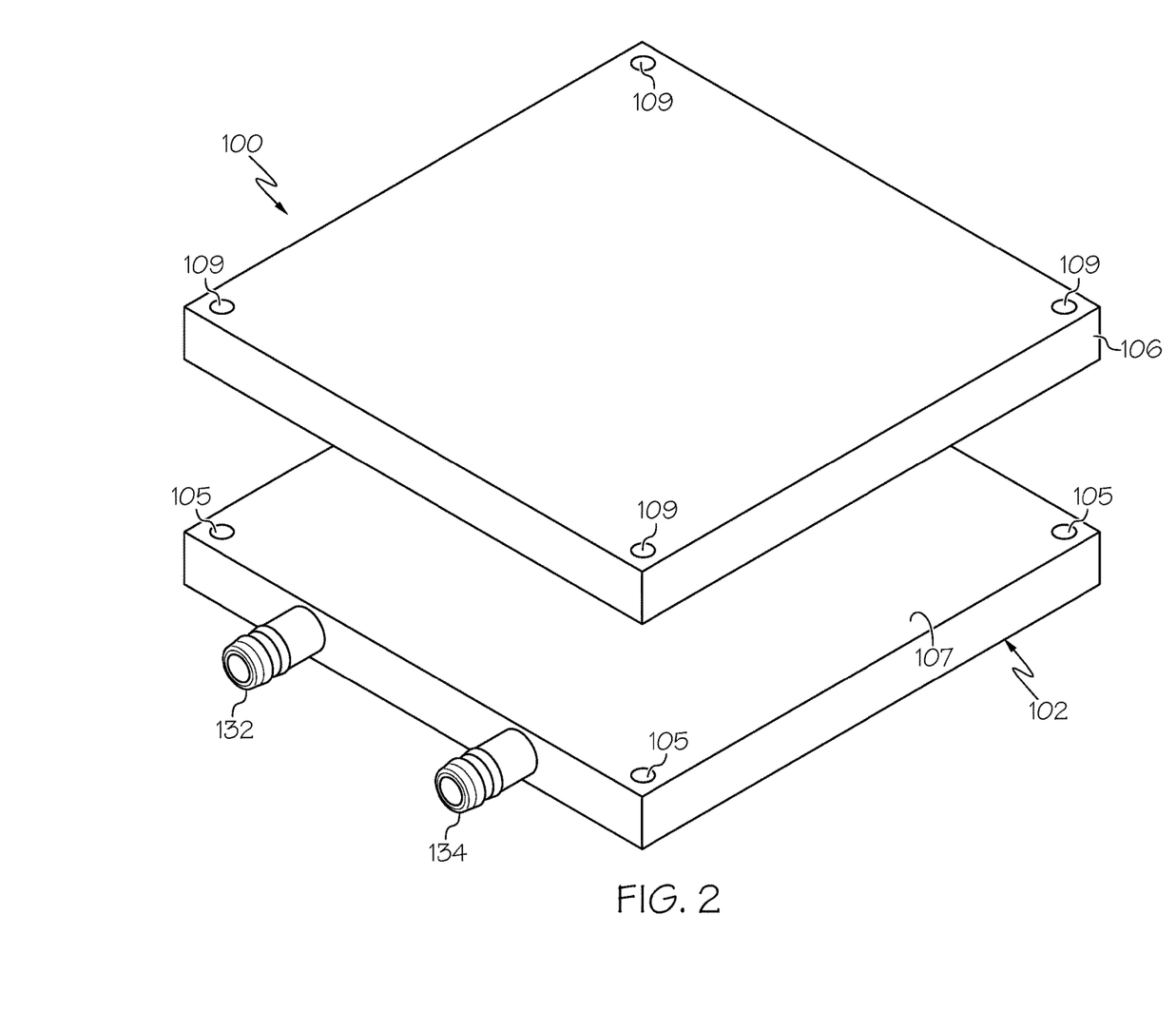
FIG. 2 schematically depicts an exploded perspective view of the power electronics system illustrated by FIG. 1 according to one or more embodiments described and illustrated herein.
Figure 3:
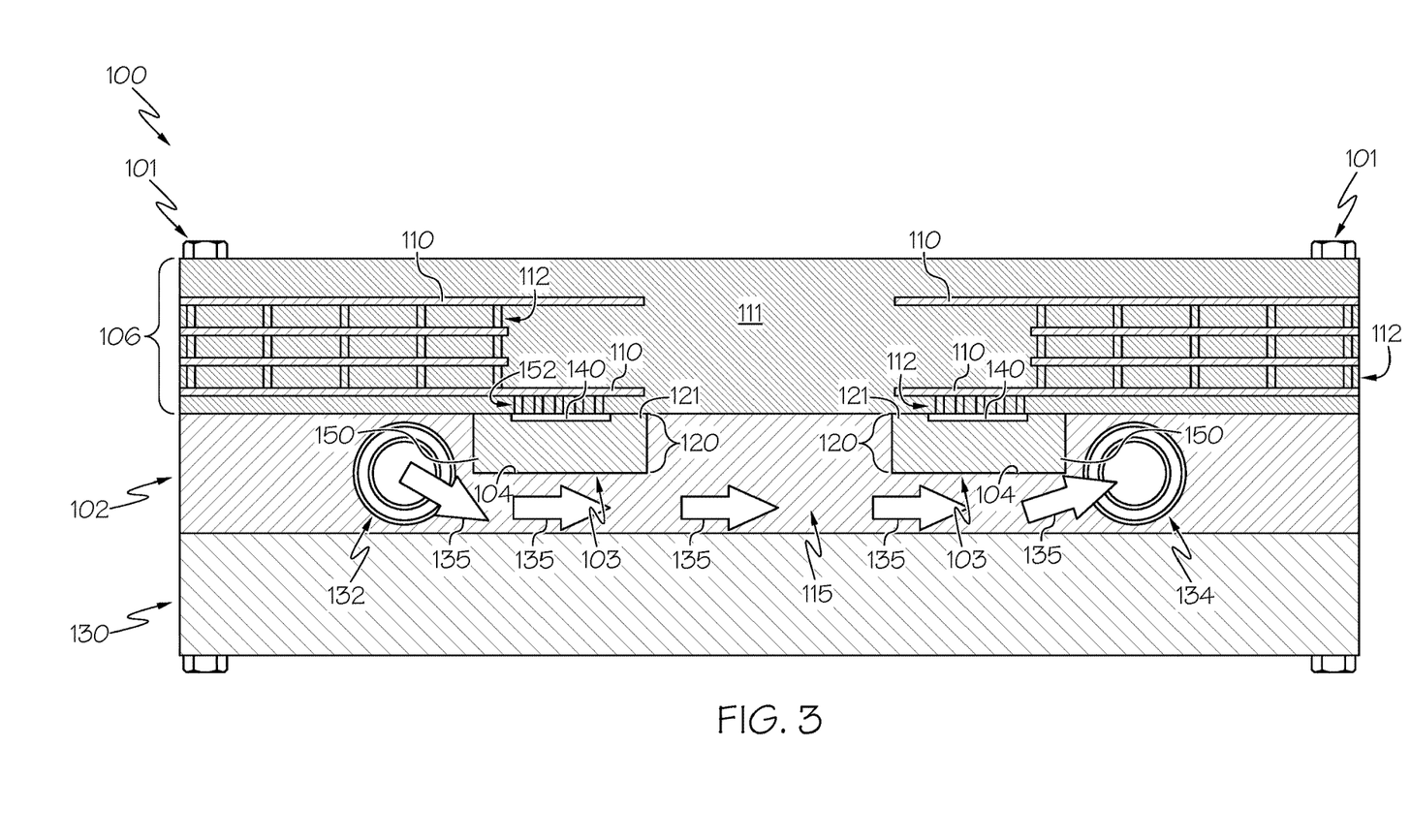
FIG. 3 schematically depicts a cross-sectional view of an illustrative power electronics system according to one or more embodiments described and illustrated herein.
Figure 6:
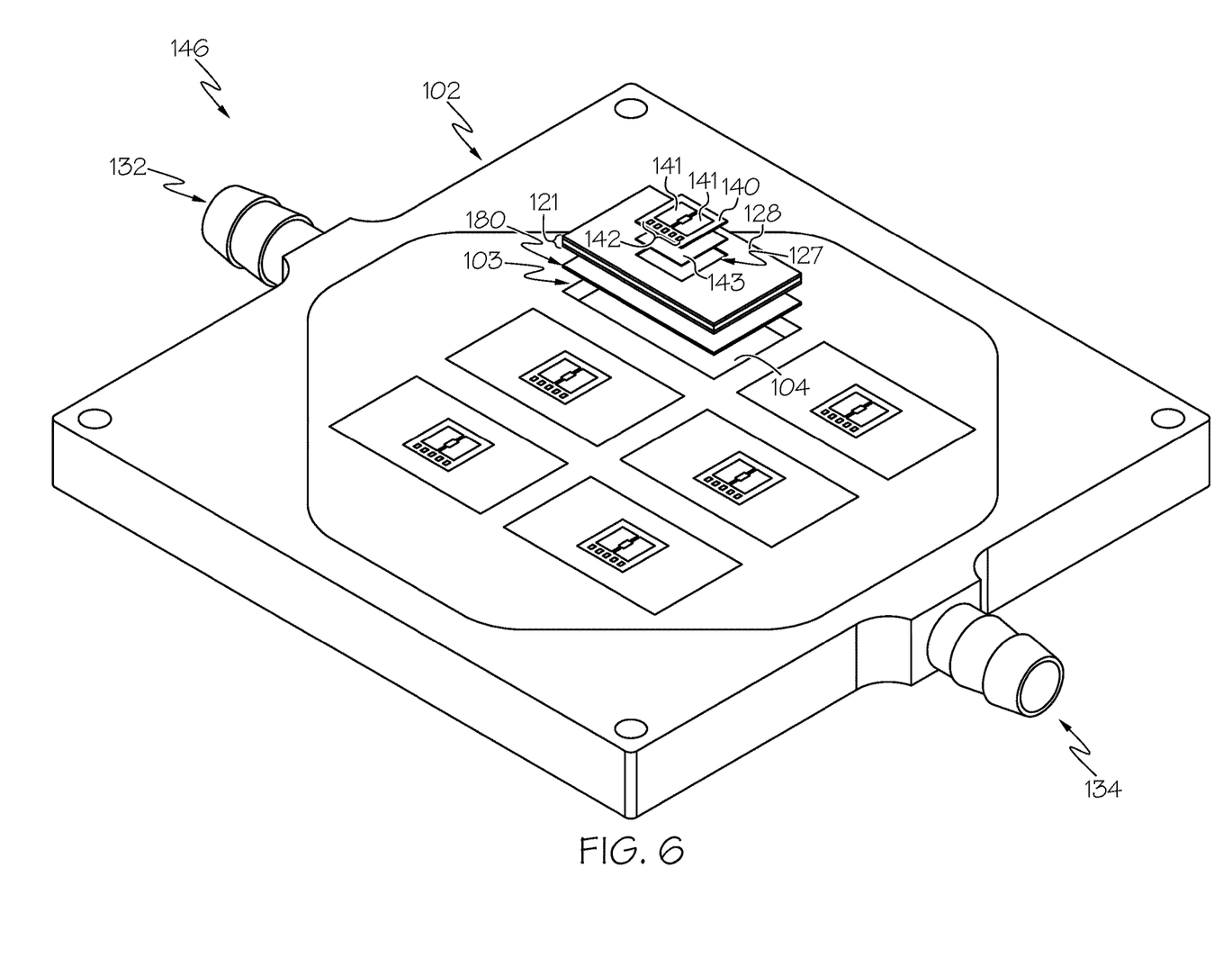
FIG. 6 schematically illustrates a top exploded perspective view of an illustrative cold plate having a plurality of S-cells embedded therein according to one or more embodiments described and illustrated herein.

Referring now to FIGS. 1 and 2, an example power electronics system 100 is illustrated in an assembled view and an exploded view, respectively. The power electronics system 100 illustrated by FIGS. 1 and 2 includes a cold plate 102 and a circuit board assembly 106. While not shown in FIGS. 1 and 2, in some embodiments a bond layer or a thermal grease layer may be disposed between the cold plate 102 and the circuit board assembly 106. The cold plate 102 may be any device capable of removing heat flux from power electronics devices 140 (see FIG. 3) coupled to or embedded within a cavity 103 of the cold plate 102 and/or coupled to or embedded within a substrate material of the circuit board assembly 106. Non-limiting examples for the cold plate 102 include heat sinks, single-phase liquid cooling, two-phase liquid cooling, and vapor chambers. FIGS. 1 and 2 illustrate the cold plate 102 has being configured as a single-phase liquid cooling device. The cold plate 102 includes a fluid inlet 132 and a fluid outlet 134 fluidly coupled to a fluid chamber 115 within the cold plate 102. While FIGS. 1 and 2 depict the fluid inlet 132 and the fluid outlet 134 as being on the same side of the cold plate 102, the present disclosure is not limited to such an embodiment. That is, in other embodiments, the fluid inlet 132 and the fluid outlet 134 may be positioned on other surfaces. For example, FIG. 6 depicts the fluid inlet 132 on a first surface and the fluid outlet 134 on a second surface that is opposite the first surface. Referring briefly to FIG. 3, cooling fluid (depicted as moving arrows 135) from a reservoir (not shown) flows into the fluid chamber 115 through the fluid inlet 132 and out of the fluid chamber 115 through the fluid outlet 134, where it is returned to the reservoir, such as after flowing through a heat exchanger (not shown) to remove heat from the cooling fluid. Although not shown, an array of fins may be provided in the fluid chamber 115 to provide additional surface area for heat transfer to the cooling fluid 135.

Referring again to FIGS. 1 and 2, the circuit board assembly 106 is coupled (e.g., affixed) to a first surface 107 of the cold plate 102. FIGS. 1 and 2 illustrate the circuit board assembly 106 as being affixed to the first surface 107 of the cold plate 102 by way of fasteners 101 (e.g., bolts and nuts) disposed through through-holes 105 of the cold plate 102 and through-holes 109 of the circuit board assembly 106. When fasteners 101 are used, a bond layer disposed between the cold plate 102 and the circuit board assembly 106 may be a thermal grease layer to lower the thermal resistance between the circuit board assembly 106 and cold plate 102. It is noted that such a bond layer configured as thermal grease will not have dedicated through-holes. It should be appreciated that such an embodiment as depicted in FIGS. 1 and 2 may be used particularly when an additional electrical component 130 (see FIG. 3) is coupled to the cold plate 102. If such a component is not included, the through-holes 105, 109 and fasteners 101 may be omitted, as described below.

In other embodiments, the circuit board assembly 106 is coupled (e.g., affixed) to the first surface 107 of the cold plate 102 by a bond layer disposed therebetween and configured as a solder layer. For example, the bottom surface of the circuit board assembly 106 may include a metal layer that enables the circuit board assembly 106 to be coupled (e.g., affixed) to the first surface 107 of the cold plate 102 by a solder layer. Other bonding methods may be utilized as well without departing from the scope of the present disclosure.

In still other embodiments, the circuit board assembly 106 may be 3D printed layers that are 3D printed directly on the cold plate 102 (e.g., 3D printed on the first surface 107 of the cold plate 102). It should be appreciated that in such embodiments, the 3D printed layers of the circuit board assembly 106 reduce overall thermal resistance. Other additive manufacturing processes for affixing the circuit board assembly 106 to the cold plate 102 are also contemplated and included within the scope of the present disclosure.

In still other embodiments, the circuit board assembly 106 may be laminated to the first surface 107 of the cold plate 102. In addition, via connections may be made between the various components of the circuit board assembly 106 and the power electronics device assemblies 120 (FIG. 3) using laser drilling. That is, the vias are drilled through the laminated circuit board assembly 106 to the top surface of each conductive layer and the power devices of the power electronics device assemblies 120. The vias are then filled with copper via an electroplating method to establish electrical connections between components.

Referring now to FIG. 3, a cross-sectional view of the example power electronics system 100 is illustrated. In the illustrated embodiment, an additional electrical component 130 is coupled (e.g., affixed) to a second surface of the cold plate 102. As a non-limiting example, the additional electrical component 130 may be a capacitor of an inverter circuit, for example. It should be understood that an additional electrical component 130 may not be affixed to the cold plate 102 in other embodiments.

The circuit board assembly 106 includes a substrate 111 made of an electrically insulating material. The electrically insulating material may be a material used in the fabrication of printed circuit boards, such as, without limitation, FR-4. The circuit board assembly 106 further includes embedded electrically conductive layers 110, a plurality of vias 112 (both electrically conducting vias and thermal vias). In some embodiments, the circuit board assembly 106 may also include a plurality of power electronics device assemblies 120 fully or partially embedded therein. However, the embodiment depicted in FIG. 3 shows the power electronics device assemblies 120 embedded within an S-cell 121 that is disposed within a cavity 103 of the cold plate 102, as described in greater detail herein.

As a non-limiting example, the cold plate 102 may include six cavities 103 therein for receiving six S-cells 121 and six power electronics device assemblies 120 for an inverter circuit for an electric vehicle. However, it should be understood that any number of S-cells and power electronics device assemblies may be utilized depending on the application.

Each power electronics device assembly 120 includes an S-cell 121 received within a cavity 103 of the cold plate 102 and a power electronics device 140 coupled (e.g., affixed) to the S-cell 121. As stated above, the S-cell 121 is a substrate to which the power electronics device 140 is bonded. The S-cell 121 provides an electrically conductive surface area to make connections to electrodes on the bottom surface of the power electronics device 140. The S-cell 121 further provides heat spreading functionality as well as electrical isolation. However, in some embodiments, an additional electrically insulating layer 180 may be interposed between the S-cell 121 and a base wall 104 of the cavity 103 of the cold plate 102 to provide additional electrical isolation, as described in further detail herein.

As a non-limiting example, an S-cell 121 may be disposed in each of the six cavities 103 of the cold plate for a total of six S-cells 121. Further, a power electronics device assembly 120 may be embedded in each of the six S-cells 121 for a total of six power electronics device assemblies 120. In a conventional arrangement, the shape and size of a conventional S-cell causes uniform heat spreading from each of the S-cells, which results in heat spreading between S-cells, particularly in the centrally-located S-cells, thereby decreasing the overall cooling performance of the cold plate. Accordingly, the S-cells 121 of the present disclosure are particularly shaped and sized to ensure that heat flux is directed in a manner that avoids the spread of heat to adjacent S-cells, as described below.

Figure 4:
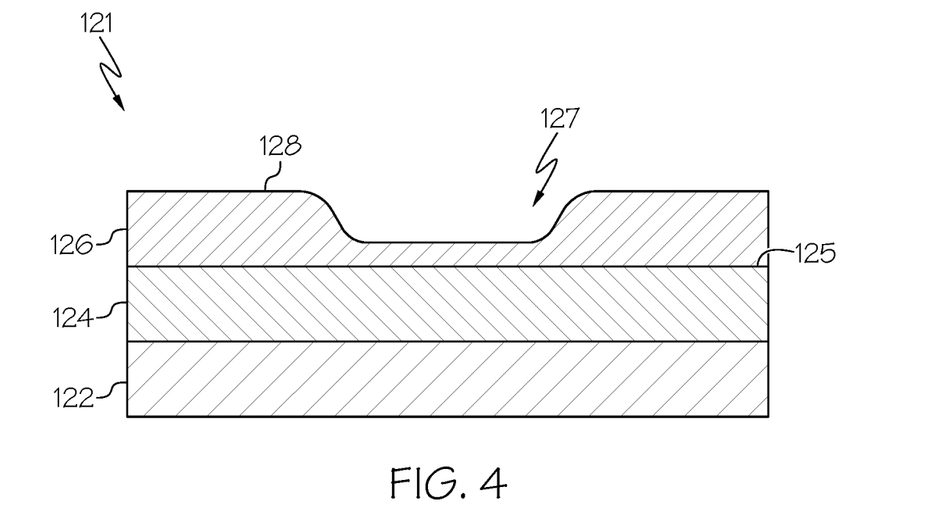
FIG. 4 schematically illustrates a cross-sectional view of an illustrative S-cell according to one or more embodiments described and illustrated herein.
Figure 5:
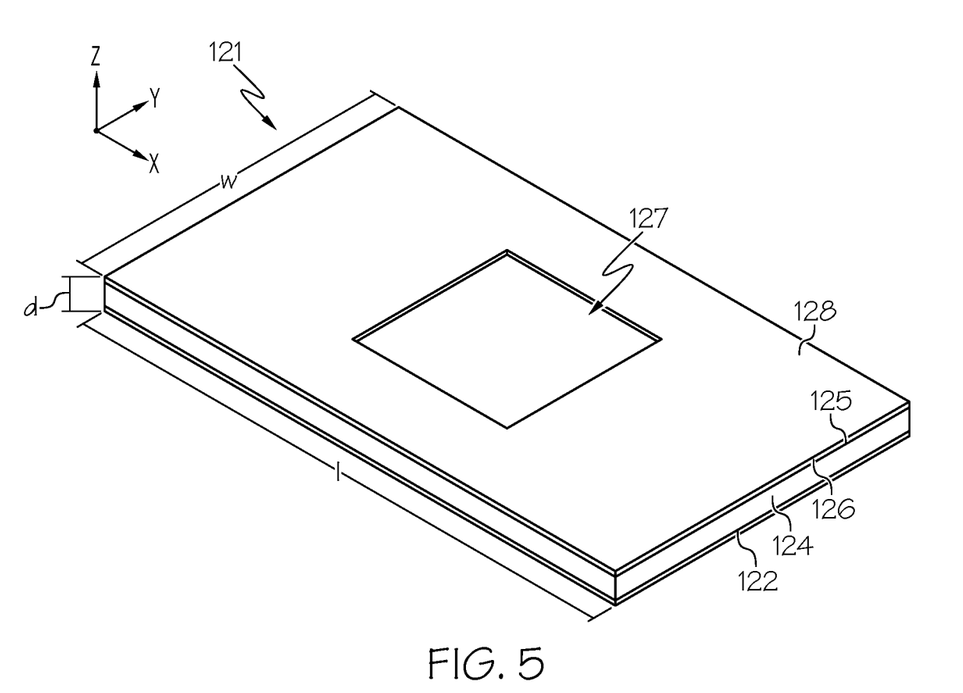
FIG. 5 schematically illustrates a perspective view of the S-cell of FIG. 4 according to one or more embodiments described and illustrated herein.

FIGS. 4 and 5 illustrate an example S-cell 121 in a cross-sectional view and a top perspective view, respectively. The S-cell 121 includes a body 131 formed from a plurality of stacked layers. Particularly, the S-cell 121 illustrated by FIGS. 4 and 5 includes a body 131 that includes a first metal layer 122, graphite layer 124, and a second metal layer 126. The second metal layer 126 includes a first face 125 facing the graphite layer and a second face 128 opposite the first face 125, the second face 128 having a recess 127 dimensioned to receive a power electronics device 140 therein. As depicted in FIGS. 4 and 5, the first and second metal layers 122, 126 at least partially surround the graphite layer 124. As used herein, the term "graphite-composite material" is meant to encompass such a structure whereby the graphite is at least partially surrounded by a metal as depicted in FIGS. 4 and 5 and described in further detail hereinbelow. As also described in more detail below, the second metal layer 126 provides an electrically conductive surface to which electrically conductive vias may contact to make an electrical connection to electrodes on a bottom surface of the power electronics device 140. It should be appreciated that the various layers of the S-cell 121 depicted in FIGS. 4 and 5 is merely illustrative. That is, for example, the S-cell 121 may have one or more graphite layers that are at least partially surrounded by a metal portion (e.g., one or more metal layers, a metal shell, a metal casing, or the like). In still further examples, the S-cell 121 may include one or more graphite layers that are completely surrounded by a metal portion such that the metal portion encapsulates the one or more graphite layers therein. Either of these examples are encompassed by the term "graphite-composite material" as used herein.

As a non-limiting example, the layers of the S-cell may be bonded together by a high-temperature active metal brazing method that forms bond layers 129 (i.e., active metal brazing layers). However, it should be understood that the various layers may be bonded using other known and yet-to-be-developed techniques.

It is noted that the illustrated S-cell 121 in the embodiment of FIGS. 4 and 5 includes a graphite layer 124 and a pair of metal layers (i.e., first metal layer 122 and second metal layer 126) to provide an S-cell 121 that is symmetrical along a z-axis of the coordinate axes depicted in FIG. 5. The symmetrical nature of the S-cell 121 balances forces on the S-cell during the high-temperature bonding process. Because the first and second metal layers 122, 126 and the graphite layer 124 have different coefficients of thermal expansion, it may be desirable to have a symmetrical substrate stack to balance the thermally induced stresses during the bonding process.

The first and second metal layers 122, 126 may be made of any suitable metal or alloy. Copper and aluminum may be used as the first and second metal layers 122, 126 as non-limiting examples. It should further be understood that the metal portion used to at least partially or completely surround graphite layers as discussed herein may also be any suitable metal or alloy, such as (but not limited to) copper and/or aluminum.

The graphite layer 124 depicted in the embodiment of FIG. 5 is provided to encourage heat spreading both across the S-cell 121 as well as toward the cold plate 102 (FIG. 3). The crystalline structure of graphite provides the graphite with high thermal conductivity, making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the S-cell 121 is designed to be rectangular in shape such that its length dimension is larger than its width dimension. Referring to FIG. 5, the graphite layer 124 has high thermal conductivity along the x-axis and the z-axis of the coordinate axes depicted in FIG. 5. Thus, the S-cell 121 is designed such that its dimension along the x-axis is larger than its dimension along the y-axis. That is, a width w of the S-cell 121 generally corresponds to the y-axis of the coordinate axes, a length l of the S-cell 121 generally corresponds to the x-axis of the coordinate axes, and a depth d of the S-cell 121 generally corresponds to the z-axis of the S-cell 121. The length l and width w generally define the plane which gives the S-cell 121 its rectangular shape as described herein, and further generally define a lateral plane in which the recess 127 is oriented. The depth d generally defines the thickness of the S-cell 121, and further generally defines the vertical plane in which the recess 127 is oriented.

Due to the rectangular shape of the S-cell and the characteristics of the graphite, the length l and depth d of the S-cell 121 define directions of relatively high thermal conductivity, while the width w of the S-cell 121 defines a direction of relatively low thermal conductivity. In a non-limiting example, the thermal conductivity of the S-cell 121 in directions along the x-axis and the z-axis may be about 1500 W/(mK) while the thermal conductivity of the S-cell 121 in directions along the y-axis may be about 10 W/(mK).

In another nonlimiting example, the ratio of thermal conductivity of the S-cell 121 in directions along the x- and z-axes relative to the y-axis may be about 100:1, about 150:1, or values greater than about 150:1. As a result, heat flux more easily travels along the x-axis and z-axis relative to the y-axis, and thus is more likely to travel along the x-axis and the z-axis along the length 1 and depth d of the S-cell 121. This movement of heat flux ensures that heat flux is less likely to travel to adjacent S-cells 121 along the y-axis, thereby avoiding an issue where adjacent S-cells 121 are overheating one another. As described in more detail herein, thermal vias may be provided at the edges of the S-cell along the x-axis to receive heat flux and move it toward the cold plate 102. Heat flux will also travel along the z-axis toward the cold plate 102.

The second metal layer 126 of the S-cell 121 has a recess 127 formed in the second face 128 thereof. The recess 127 may be formed by chemical etching, for example. The recess 127 has a size and shape to accept a power electronics device 140 (see, e.g., FIGS. 3 and 6). The second face 128 may generally be a second major face or surface of the second metal layer 126 that is opposite the first face 125 (which is configured as a first major face or surface of the second metal layer 126). That is, the second metal layer 126 may be a planar layer whereby the first face 125 faces the graphite layer 124 and the opposite second face 128 faces the power electronics device 140 and the circuit board assembly 106 (FIG. 3).

FIG. 6 illustrates a partial exploded view of a power electronics device assembly 146 including a power electronics device 140 and the cold plate 102 that includes an S-cell 121. FIG. 6 depicts the power electronics device 140 and a bonding layer 143 with respect to the recess 127 of the S-cell 121. The bonding layer 143 may be a solder layer, for example. As another example, the bonding layer 143 may be a transient liquid phase bonding layer 143. The power electronics device 140 includes a plurality of electrodes 141, 142 on its top surface. The large electrodes 141 may be power electrodes, while the smaller electrodes 142 may be signal electrodes. It is noted that, although not visible in FIG. 6, the power electronics device 140 further includes one or more electrodes on its bottom surface. The one or more electrodes on the bottom surface of the power electronics device are electrically connected to the second metal layer 126 by placement of the power electronics device 140 into the recess 127. Thus, electrical connection to the bottom electrodes of the power electronics device 140 may be made by way of the second metal layer 126.

Referring also to FIG. 3, electrical connection to the plurality of electrodes 141, 142 and the second metal layer 126 may be made by a plurality of vias 112. These vias 112 may provide drive signals to the power electronics devices 140, as well as provide a current path for switching current. It is noted that, in some embodiments, some of the vias 112 may be configured as thermal vias that do not conduct drive signals or switching current. In addition, the S-cell arrangement within the cavity 103 of the cold plate 102 allows for flux movement from the power electronics device 140 to the cold plate via the S-cell, as described herein. In this way, heat flux is optimally directed away from the power electronics devices 140 and toward the cold plate 102 via the S-cell 121. As shown in FIG. 3, cold cooling fluid 135 enters the cold plate 102 through the fluid inlet 132, flows through the fluid chamber 115, and exits as warmed cooling fluid out of the fluid outlet 134.

Still referring to FIGS. 3 and 6, the cavity 103 of the cold plate 102 may be shaped and/or sized to receive the S-cells 121 with the power electronics devices 140 embedded therein or coupled thereto, as described herein. A bond material 180 may be disposed between the S-cell 121 and one or more walls of the cavity 103 of the cold plate 102. For example, the S-cell 121 may be bonded within the cavity 103 by applying the bond material 180 to the base wall 104 and/or one or more side walls of the cavity 103 to secure the S-cell within the cavity 121. The bond material 180 is generally not limited by the present disclosure and may generally be any material that provides bonding properties. In some embodiments, the bond material 180 may be a material that that acts as an electrical insulator, such as, for example, a dielectric. In another example, the bond material 180 may be an IMS dielectric material. However, other materials that have electrically insulative properties are contemplated and included within the scope of the present disclosure.

It should now be understood that embodiments of the present disclosure are directed to power electronics systems having a circuit board assembly coupled to a power electronics device assembly that includes a cold plate containing an S-cell. A power electronics device may be embedded within the S-cell and/or within the circuit board assembly. The S-cell is formed from graphite or a graphite-composite material, and is particularly dimensioned so that the thermal conductivity of the S-cell causes heat flux to move toward the cold plate and away from adjacent S-cells in some directions. Such power electronics systems are compact, provide increased thermal conductivity while maintaining the ability to electrically insulate S-cells, thereby improving heat flux from the S-cell to the cold plate, thereby increasing heat spreading and cooling performance of the PCB relative to conventional packages.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed:
1. A cold plate, comprising:
  an S-cell having a body comprising a graphite or graphite-composite material, the body defining a power device recess, wherein the S-cell is disposed within a cavity of the cold plate; and
  a bond material bonding the S-cell to a base wall of the cavity.

2. The cold plate of claim 1, wherein the body of the S-cell comprises a length, a width, and a depth, wherein the length and the depth of the S-cell possess a high thermal conductivity relative of the width of the S-cell.

3. The cold plate of claim 1, wherein the body of the S-cell comprises a length and a width, wherein the length is greater than the width.

4. The cold plate of claim 1, wherein the graphite-composite material of the body of the S-cell comprises graphite and a metal portion that at least partially surrounds the graphite.

5. The cold plate of claim 4, wherein the metal portion completely surrounds the graphite.

6. The cold plate of claim 4, wherein the metal portion is formed of copper or a copper-containing material.

7. The cold plate of claim 1, wherein the bond material comprises an electrically insulative material.

8. The cold plate of claim 7, wherein the thermally electrically insulative material is a dielectric material.

9. The cold plate of claim 8, wherein the dielectric material is an insulated metal substrate material.

10. The cold plate of claim 1, further comprising a fluid chamber, a fluid inlet, and a fluid outlet, wherein the fluid inlet and the fluid outlet are thermally coupled to the fluid chamber.

11. A power electronics device assembly, comprising:
a cold plate defining a cavity, the cold plate comprising:
an S-cell disposed within the cavity of the cold plate, the S-cell having a body comprising a graphite or graphite-composite material, the body defining a power device recess, and
a bond material bonding the S-cell to a base wall of the cavity; and
a power electronics device embedded within the power device recess of the S-cell.

12. The cold plate of claim 11, wherein the power electronics device is sintered to one or more surfaces of the power device recess.

13. The power electronics device assembly of claim 11, wherein the body of the S-cell comprises a length, a width, and a depth, wherein the length and the depth of the S-cell possess a high thermal conductivity relative of the width of the S-cell.

14. The power electronics device assembly of claim 11, wherein the body of the S-cell comprises a length and a width, wherein the length is greater than the width.

15. The power electronics device assembly of claim 11, wherein the body of the S-cell further comprises a metal portion that at least partially surrounds the graphite or graphite-composite material.

16. The power electronics device assembly of claim 11, wherein the bond material comprises an insulated metal substrate material.

17. A power electronics system, comprising:
a circuit board assembly; and
a power electronics device assembly coupled to the circuit board assembly, the power electronics device assembly comprising:
a cold plate defining a cavity, the cold plate comprising:
an S-cell disposed within the cavity of the cold plate, the S-cell having a body comprising a graphite or graphite-composite material, the body defining a power device recess, and
a bond material bonding the S-cell to a base wall of the cavity, and
a power electronics device embedded within the power device recess of the S-cell.

18. The power electronics system of claim 17, wherein:
the cold plate is coupled to the circuit board assembly at a first surface thereof; and
a capacitor is coupled to a second surface of the cold plate that is opposite from the first surface.

19. The power electronics system of claim 17, wherein the body of the S-cell comprises a length, a width, and a depth, wherein the length and the depth of the S-cell possess a high thermal conductivity relative of the width of the S-cell.

20. The power electronics system of claim 17, wherein the body of the S-cell comprises a length and a width, wherein the length is greater than the width.

* * * * *

UNITED STATES PATENT AND TRADEMARK OFFICE
CERTIFICATE OF CORRECTION

PATENT NO. : 12,165,954 B2
APPLICATION NO. : 17/820956
DATED : December 10, 2024
INVENTOR(S) : Feng Zhou and Hiroshi Ukegawa It is certified that error appears in the above-identified patent and that said Letters Patent is hereby corrected as shown below:

In the Specification

In Column 5, Line(s) 63, before "merely", delete "is" and insert --are--, therefor.

In Column 8, Line(s) 12, delete "that that" and insert --that--, therefor.

In the Claims

In Column 9, Line(s) 4, Claim 2, after "relative", delete "of" and insert --to--, therefor.

In Column 9, Line(s) 18, Claim 8, delete "thermally".

In Column 10, Line(s) 2, Claim 13, after "relative", delete "of" and insert --to--, therefor.

In Column 10, Line(s) 36, Claim 19, after "relative", delete "of" and insert --to--, therefor.

Signed and Sealed this
Twenty-eighth Day of January, 2025

Coke Morgan Stewart
*Acting Director of the United States Patent and Trademark Office*